(12) United States Patent
Fukuda et al.

(10) Patent No.: US 8,105,502 B2
(45) Date of Patent: Jan. 31, 2012

(54) LUMINESCENT MATERIAL

(75) Inventors: Yumi Fukuda, Tokyo (JP); Jun-ichi Tatami, Yokohama (JP); Hironori Asai, Yokohama (JP); Katsutoshi Komeya, Naka-gun (JP); Naotoshi Matsuda, Chigasaki (JP); Toru Wakihara, Yokohama (JP); Keiko Albessard, Yokohama (JP); Shoko Abe, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 642 days.

(21) Appl. No.: 12/211,969

(22) Filed: Sep. 17, 2008

(65) Prior Publication Data
US 2009/0072195 A1 Mar. 19, 2009

(30) Foreign Application Priority Data

Sep. 18, 2007 (JP) .................................. 2007-241577

(51) Int. Cl.
*C09K 11/08* (2006.01)
(52) U.S. Cl. .......... 252/301.4 R; 252/301.4 F; 313/503; 313/486; 257/98
(58) Field of Classification Search ........... 252/301.4 R, 252/301.4 F; 313/503, 486; 257/98
See application file for complete search history.

(56) References Cited

U.S. PATENT DOCUMENTS
2007/0007494 A1 1/2007 Hirosaki et al.
2008/0251764 A1* 10/2008 Starick et al. .......... 252/301.4 R FOREIGN PATENT DOCUMENTS
JP 2006-8721 1/2006
JP 2006-16413 1/2006
WO WO 2007/025973 * 3/2007

OTHER PUBLICATIONS
U.S. Appl. No. 12/207,771, filed Sep. 10, 2008, Fukuda, et al.
U.S. Appl. No. 13/036,410, filed Feb. 28, 2011, Matsuda, et al.
U.S. Appl. No. 13/039,082, filed Mar. 2, 2011, Kato, et al.

* cited by examiner

*Primary Examiner* — Carol M Koslow
(74) *Attorney, Agent, or Firm* — Oblon, Spivak, McClelland, Maier & Neustadt, L.L.P.

(57) ABSTRACT

A luminescent material is provided, which includes a carbide oxynitride-based compound having a composition represented by formula 1:

$$(M_{1-w}R_w)_u Al_{1-x} Si_{1+v} O_z N_t C_y \qquad \text{formula 1}$$

wherein M is at least one metal element excluding Si and Al, and R is a luminescent central element. w, u, x, v, z, t and y satisfy following relationships:
$0.001 < w < 0.5$; $0.66 \leq u \leq 1$; $0.07 \leq x \leq 0.73$;
$0.06 \leq v \leq 0.84$; $0.04 \leq z \leq 0.44$; $2.7 \leq t \leq 3.1$; and
$0.019 \leq y \leq 0.13$.

15 Claims, 13 Drawing Sheets

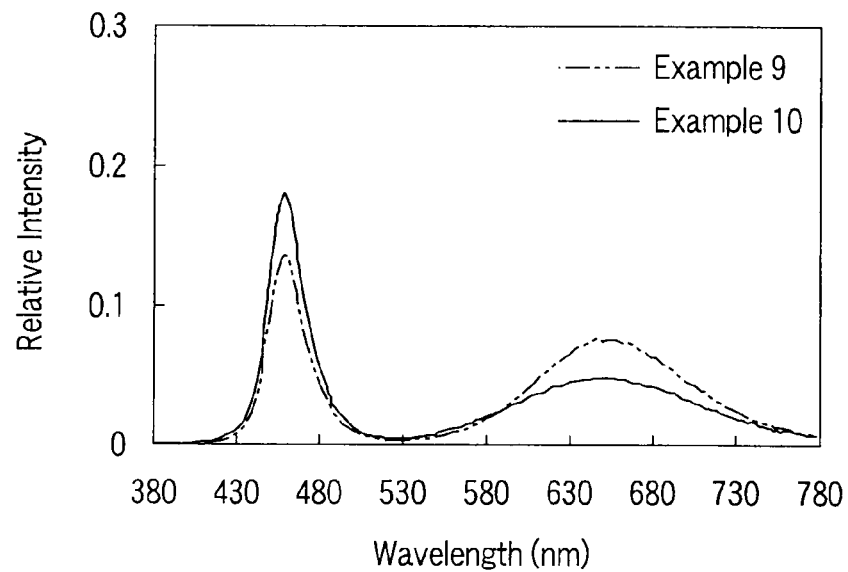
F I G. 7
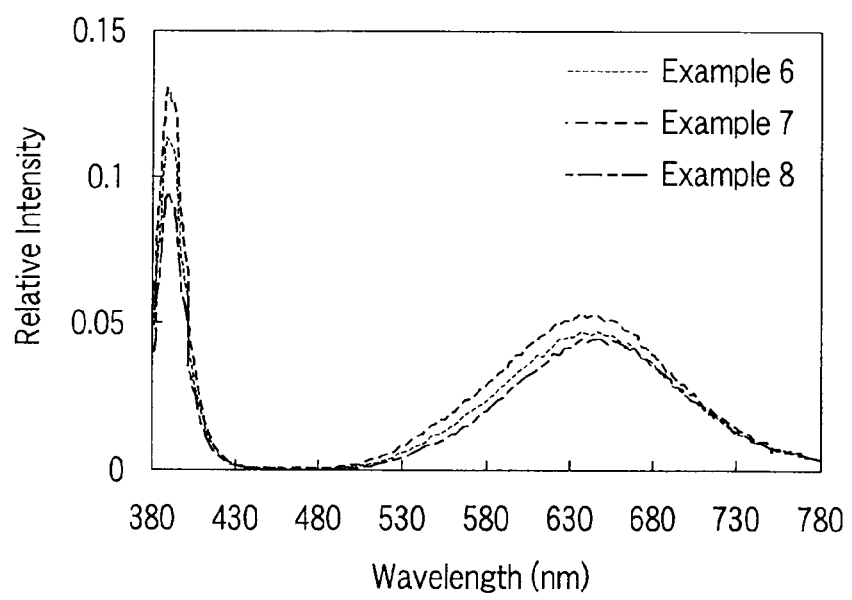
F I G. 8

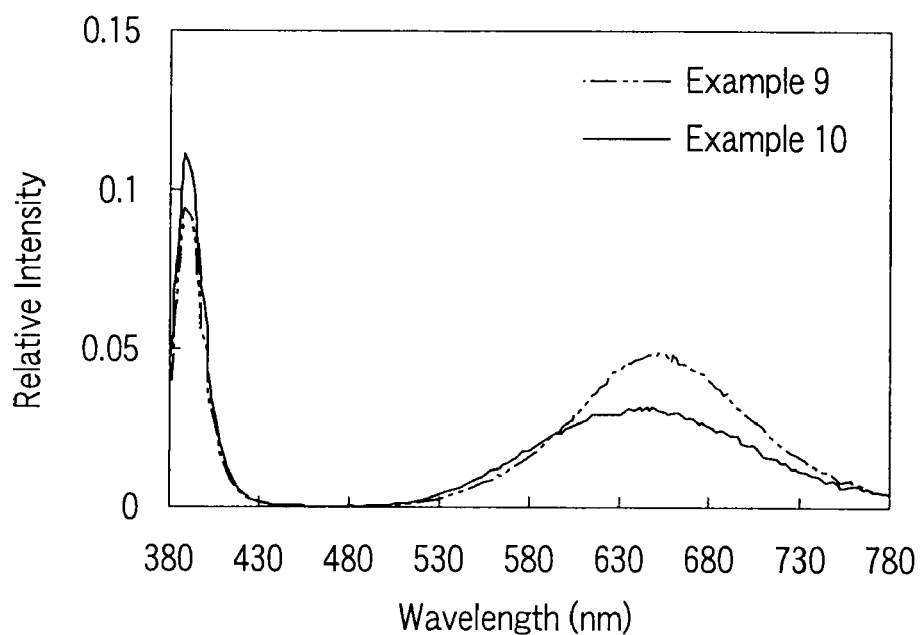
F I G. 9
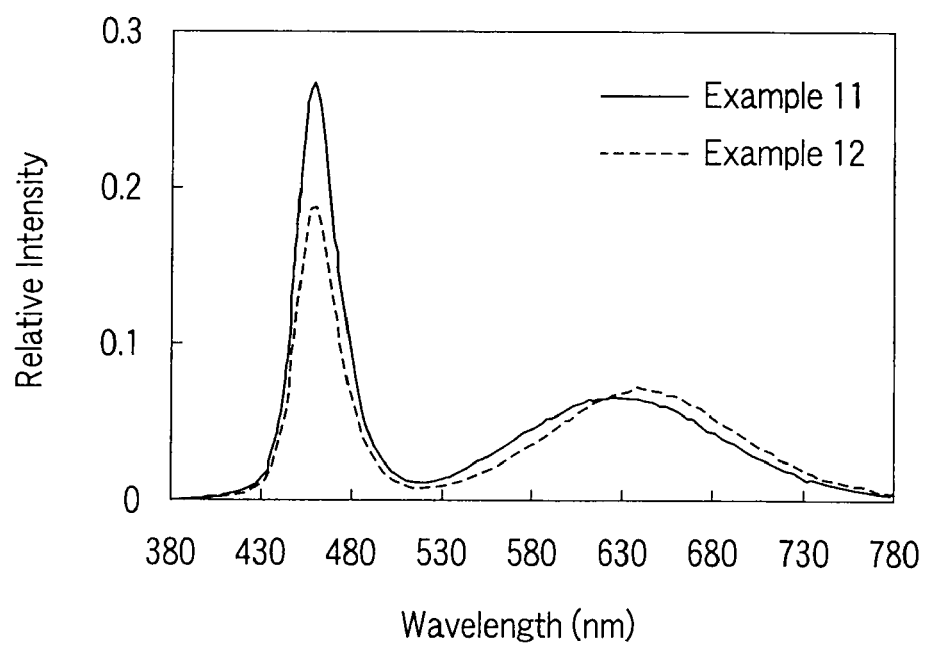
F I G. 10

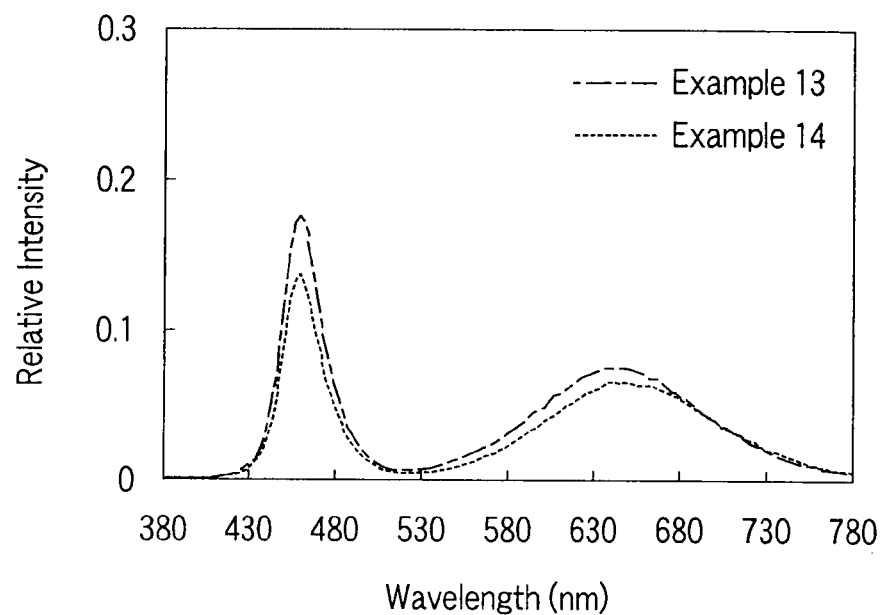
F I G. 11
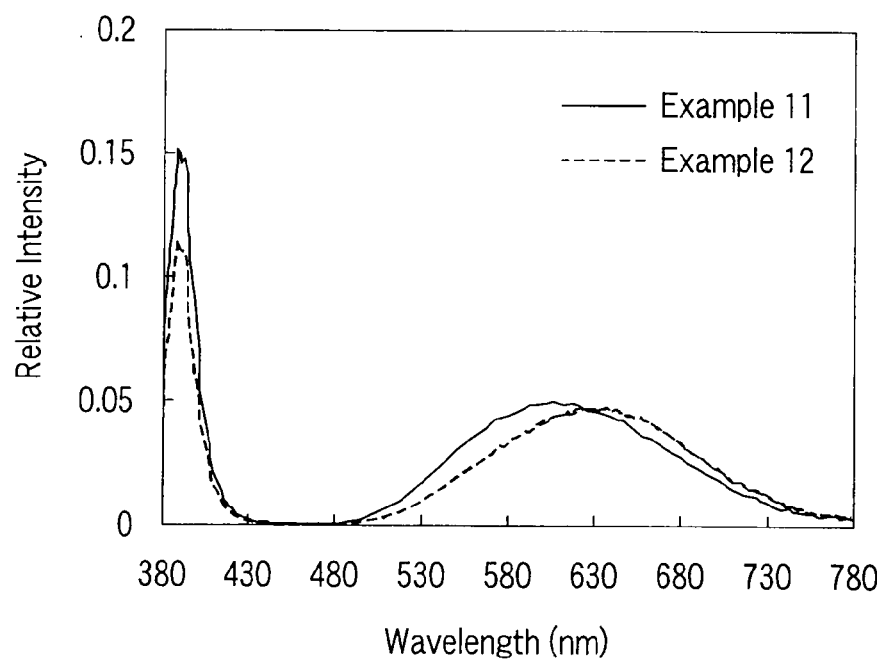
F I G. 12

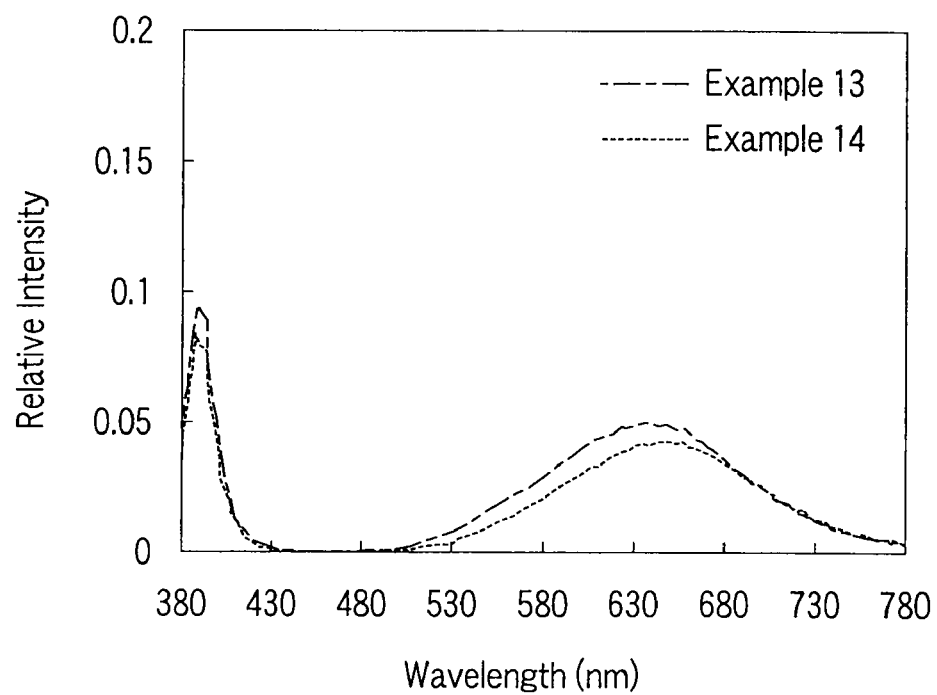
F I G. 13
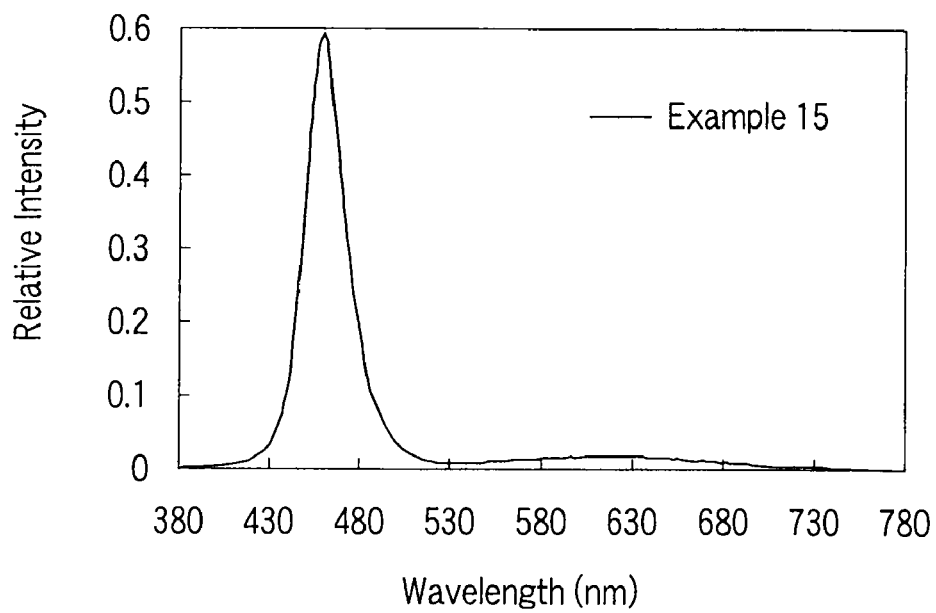
F I G. 14

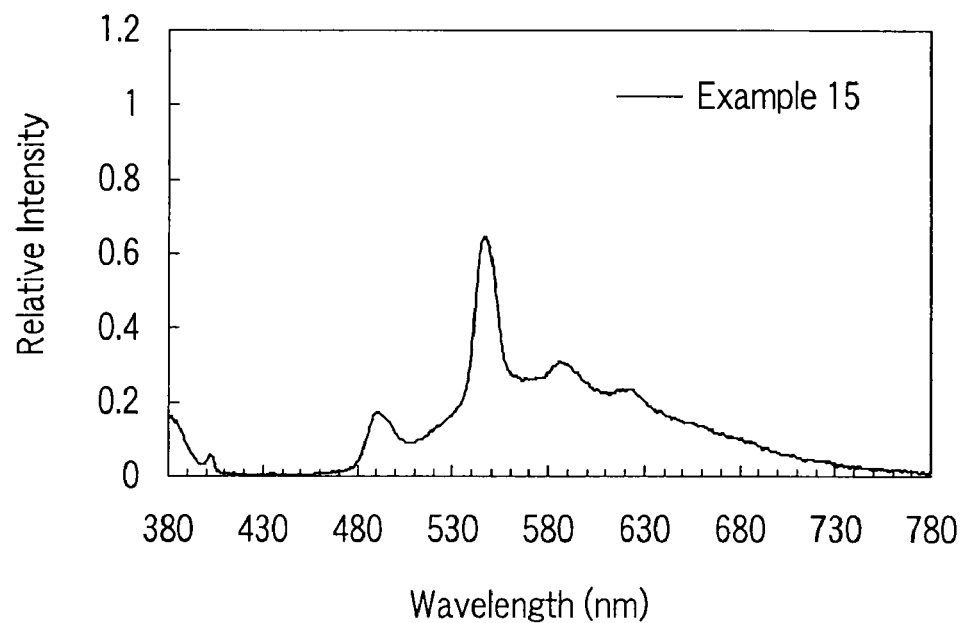
F I G. 15
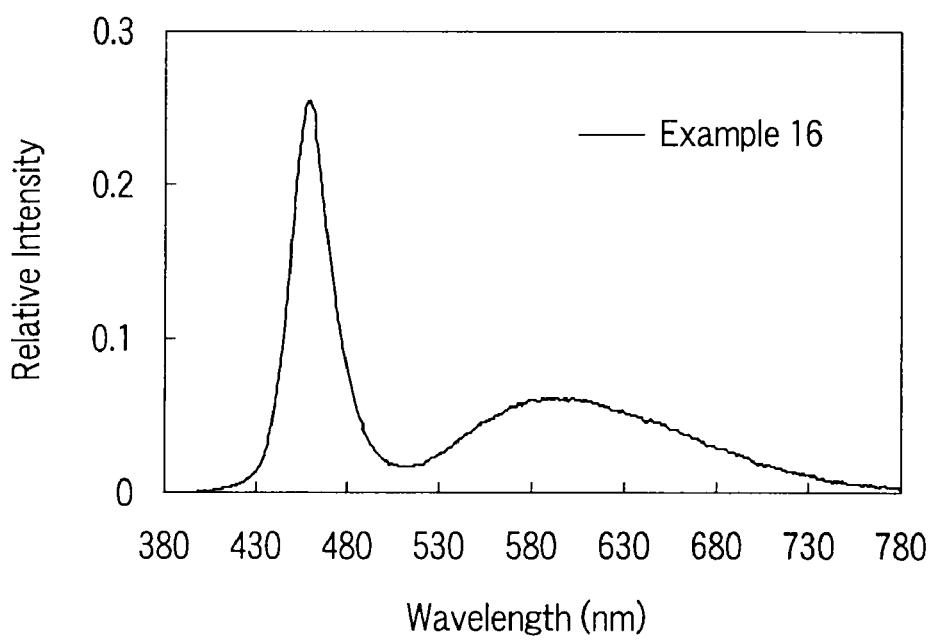
F I G. 16

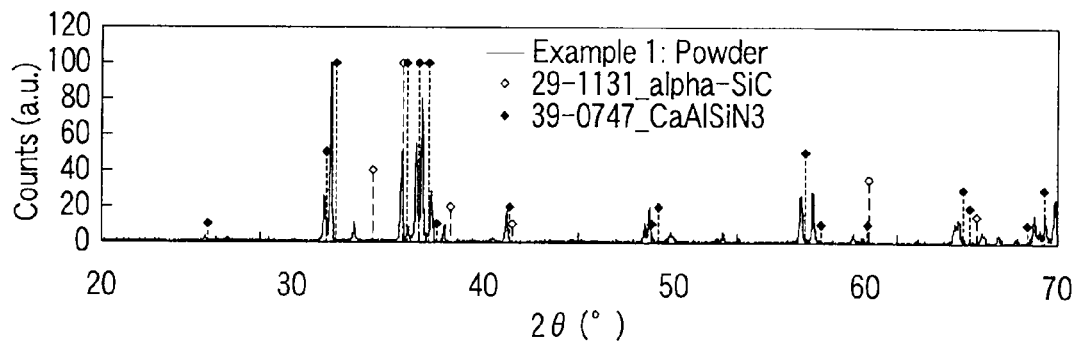
F I G. 17
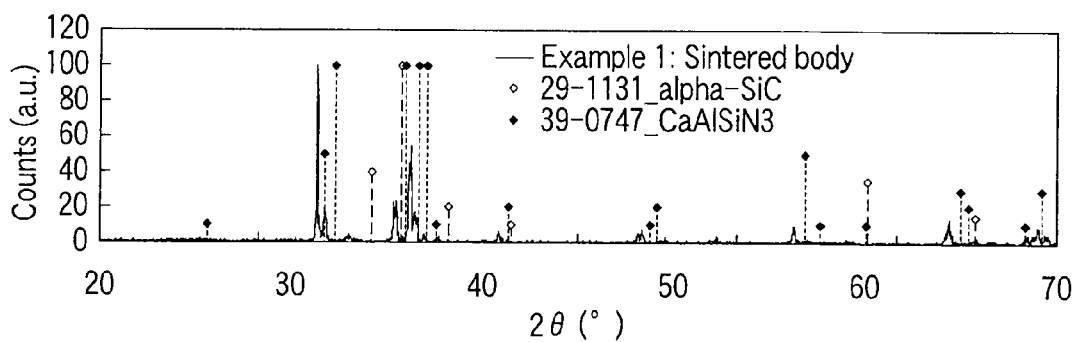
F I G. 18
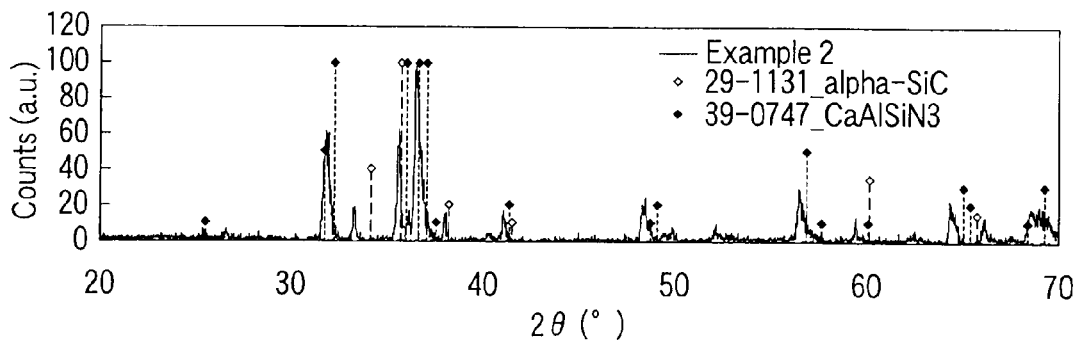
F I G. 19

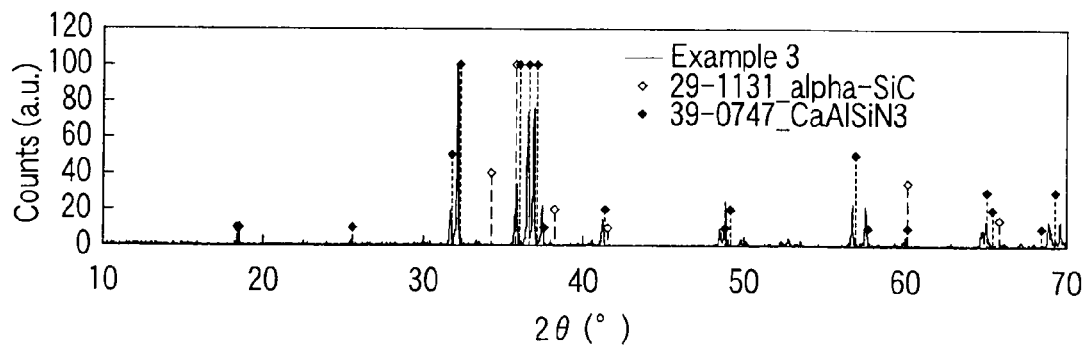
F I G. 20
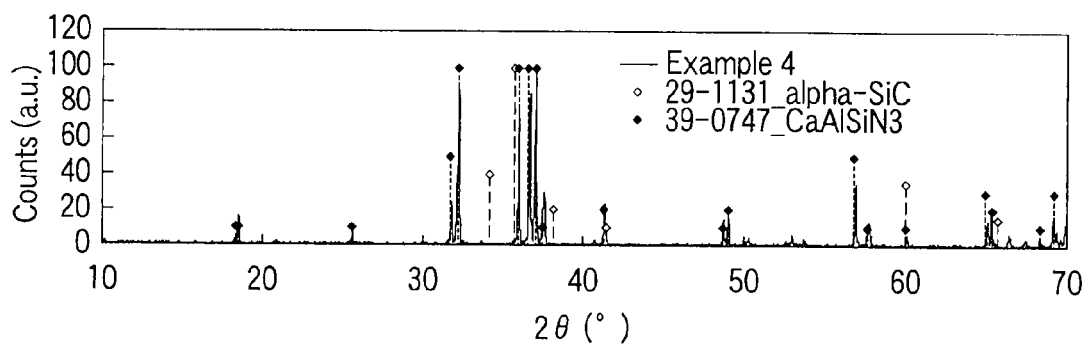
F I G. 21
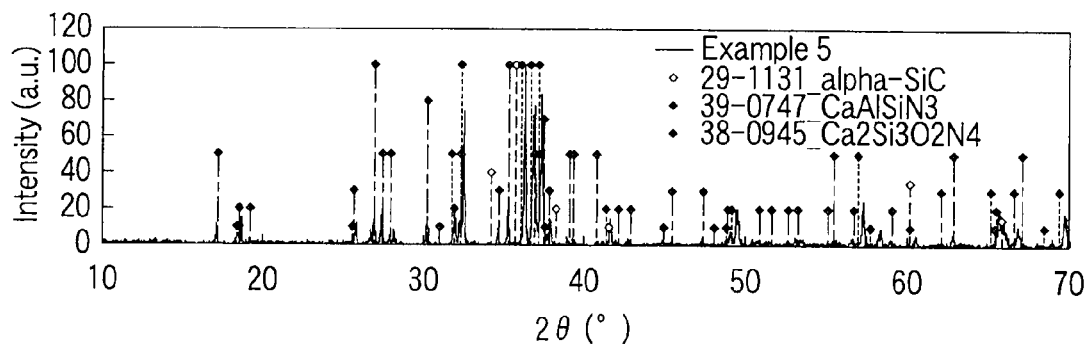
F I G. 22

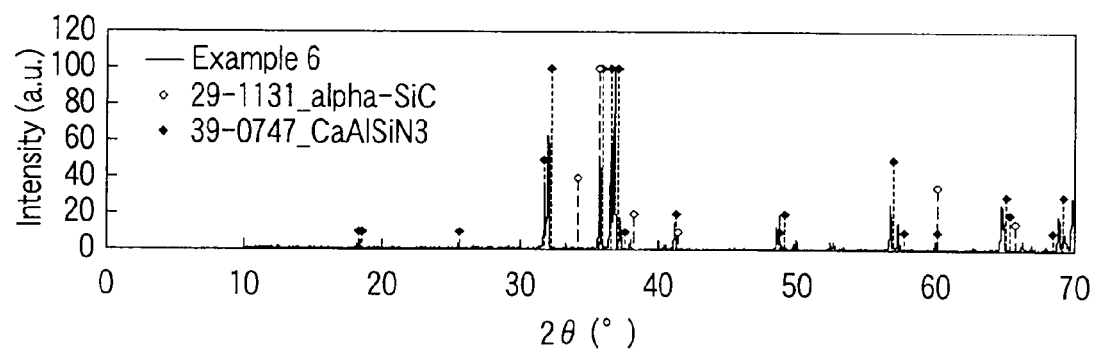
F I G. 23
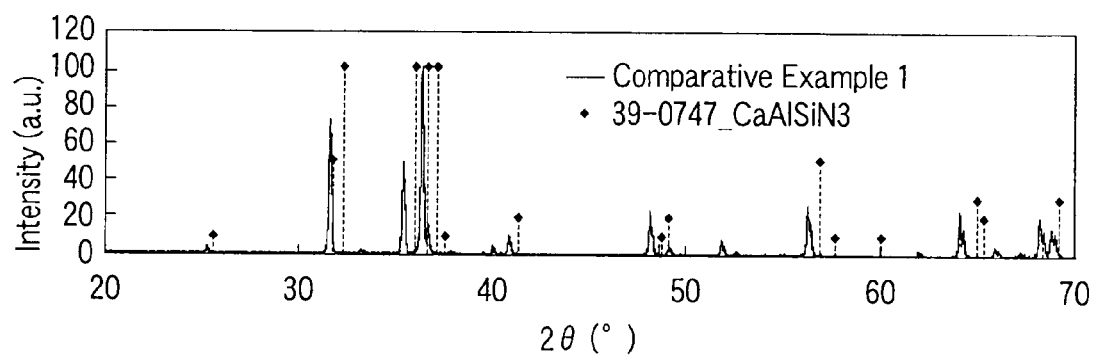
F I G. 24

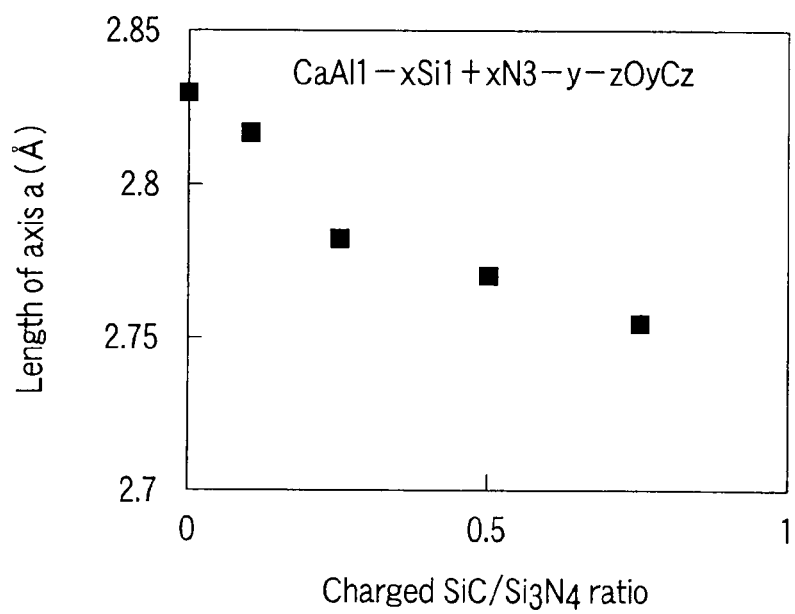
F I G. 25
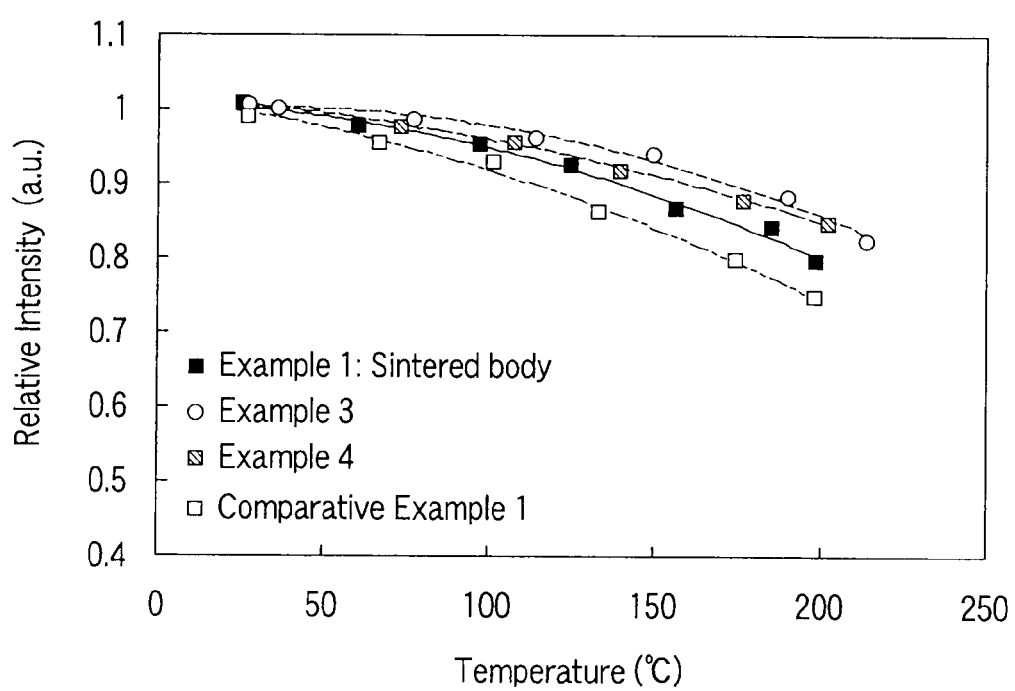
F I G. 26

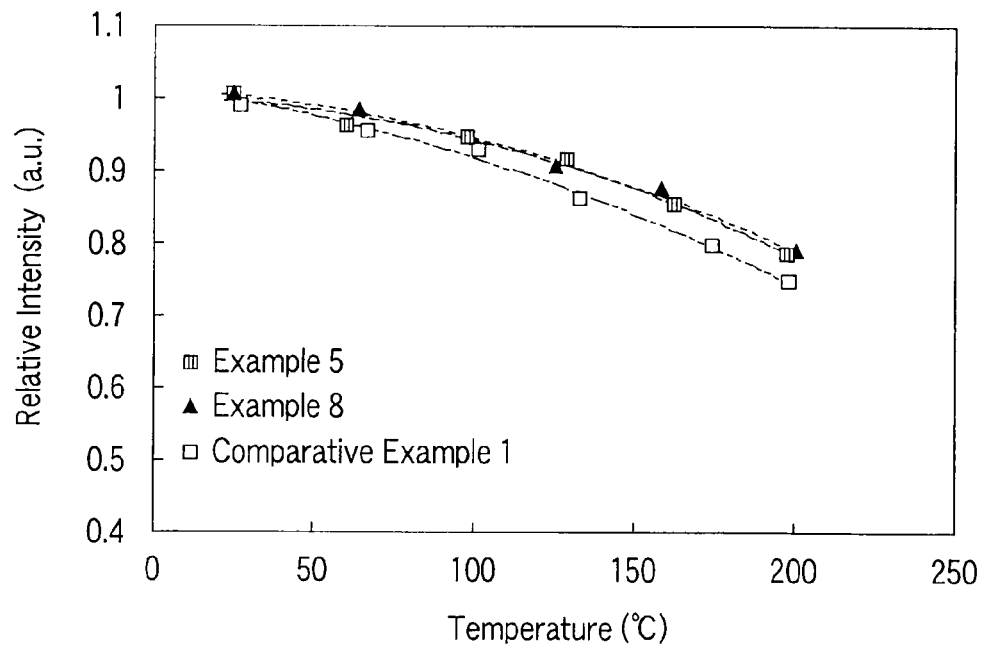
F I G. 27
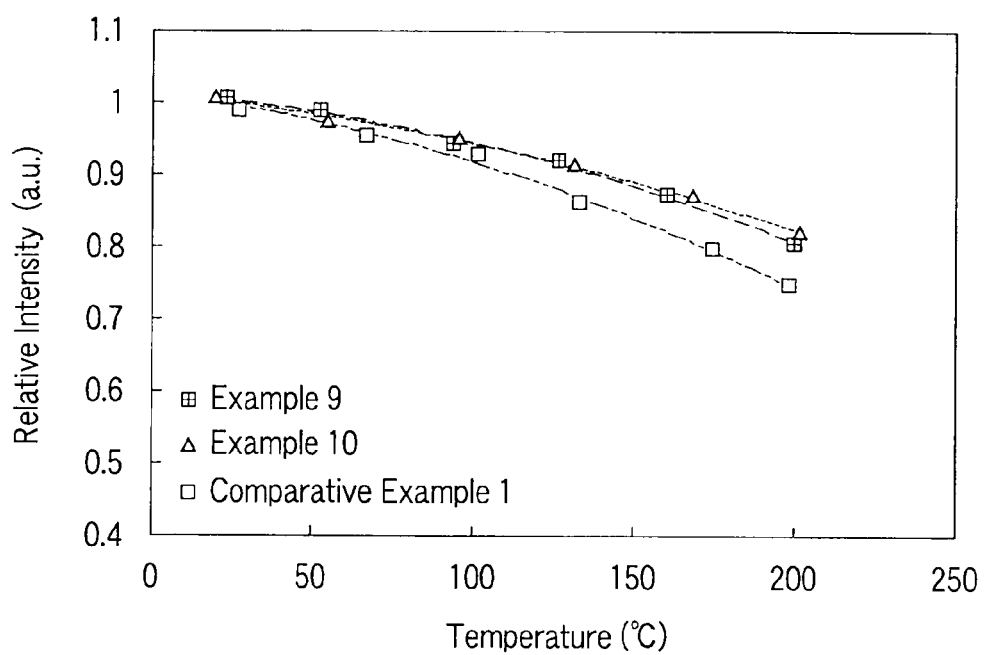
F I G. 28

LUMINESCENT MATERIAL

CROSS-REFERENCE TO RELATED APPLICATIONS

This application is based upon and claims the benefit of priority from prior Japanese Patent Application No. 2007-241577, filed Sep. 18, 2007, the entire contents of which are incorporated herein by reference.

BACKGROUND OF THE INVENTION

1. Field of the Invention

The present invention relates to a luminescent material used in a light-emitting device and in particular to a luminescent material used in a display such as a vacuum florescent display (VFD) or a plasma display panel (PDP) or in a light-emitting device using a blue light-emitting diode (blue LED) or an ultraviolet-emitting diode as a light source.

2. Description of the Related Art

A LED lamp using a light-emitting diode is used in mobile devices, PC peripheral units, OA equipments, various switches, light sources for backlight, and various display units such as a display panel. High-intensity LED generates heat by driving, so the temperature of the luminescent material therein is increased to about 100 to 200° C., which results in a reduction in the emission intensity of the luminescent material. The luminescent material desirably shows excellent temperature characteristics, that is, less reduction in emission intensity upon increase in temperature.

JP-A 2006-8721 (KOKAI) and JP-A 2006-16413 (KOKAI) have reported $CaAlSiN_3$:Eu as a red luminescent material for LED lamp using the light-emitting diode. Such luminescent material when excited in a broad (ultraviolet to blue) wavelength range shows luminescence in the range of an orange color region to an infrared region. Among many luminescent materials, this $CaAlSiN_3$:Eu has relatively excellent temperature characteristics.

It is estimated that as the power of LED lamp is increased, the temperature of the device is further increased. Accordingly, the luminescent material has been required to have more excellent temperature characteristics.

BRIEF SUMMARY OF THE INVENTION

A luminescent material according to one aspect of the present invention comprises a carbide oxynitride-based compound having a composition represented by formula 1:

$$(M_{1-w}R_w)_u Al_{1-x} Si_{1+x} O_z N_t C_y \quad \text{formula 1}$$

wherein M is at least one metal element excluding Si and Al, R is a luminescent central element, w, u, x, v, z, t and y satisfy following relationships:
0.001<w<0.5; 0.66≦u≦1; 0.07≦x≦0.73;
0.06≦v≦0.84; 0.04≦z≦0.44; 2.7≦t≦3.1; and
0.019≦y≦0.13.

A luminescent material according to another aspect of the present invention comprises a carbide oxynitride-based compound which contains at least one selected from the group consisting of Mg, Ca, Sr, Ba, Y, Gd, La, Lu, Sc, Li, Na, K, B, Ga, In and Ge; a luminescent central element; and Al and Si, and which shows an emission peak at a wavelength between 580 and 700 nm upon excitation with light having a wavelength ranging from 250 nm to 500 nm.

A light-emitting device according to another aspect of the present invention comprises a light-emitting element emitting light having a wavelength ranging from 250 to 500 nm; and a luminescent layer comprising a luminescent material configured to be irradiated with the light, at least part of the luminescent material being the aforementioned luminescent material.

BRIEF DESCRIPTION OF THE SEVERAL VIEWS OF THE DRAWING

FIG. 7 is an emission spectrum of luminescent materials in Examples 9 and 10 photoexcited at 457 nm;
FIG. 8 is an emission spectrum of luminescent materials in Examples 6 to 8 photoexcited at 395 nm;
FIG. 9 is an emission spectrum of luminescent materials in Examples 9 and 10 photoexcited at 395 nm;
FIG. 10 is an emission spectrum of luminescent materials in Examples 11 and 12 photoexcited at 457 nm;
FIG. 11 is an emission spectrum of luminescent materials in Examples 13 and 14 photoexcited at 457 nm;
FIG. 12 is an emission spectrum of luminescent materials in Examples 11 and 12 photoexcited at 395 nm;
FIG. 13 is an emission spectrum of luminescent materials in Examples 13 and 14 photoexcited at 395 nm;
FIG. 14 is an emission spectrum of a luminescent material in Example 15 photoexcited at 457 nm;
FIG. 15 is an emission spectrum of a luminescent material in Example 15 photoexcited at 365 nm;
FIG. 16 is an emission spectrum of a luminescent material in Example 16 photoexcited at 457 nm;
FIG. 17 is an XRD profile of powder in Example 1;
FIG. 18 is an XRD profile of a sintered body in Example 1;
FIG. 19 is an XRD profile in Example 2;
FIG. 20 is an XRD profile in Example 3;
FIG. 21 is an XRD profile in Example 4;
FIG. 22 is an XRD profile in Example 5;
FIG. 23 is an XRD profile in Example 6;
FIG. 24 is an XRD profile in Comparative Example 1;
FIG. 25 is a graph showing the length of axis a of a luminescent material in each of Examples 1 to 4 and Comparative Example 1;
FIG. 26 is a graph showing temperature characteristics with respect to emission intensity of luminescent materials in Examples 1, 3 and 4 and Comparative Example 1 photoexcited at 457 nm;
FIG. 27 is a graph showing temperature characteristics with respect to emission intensity of luminescent materials in Examples 5 and 8 and Comparative Example 1 photoexcited at 457 nm;
and
FIG. 28 is a graph showing temperature characteristics with respect to emission intensity of luminescent materials in Examples 9 and 10 and Comparative Example 1 photoexcited at 457 nm.

DETAILED DESCRIPTION OF THE INVENTION

Figure 1:
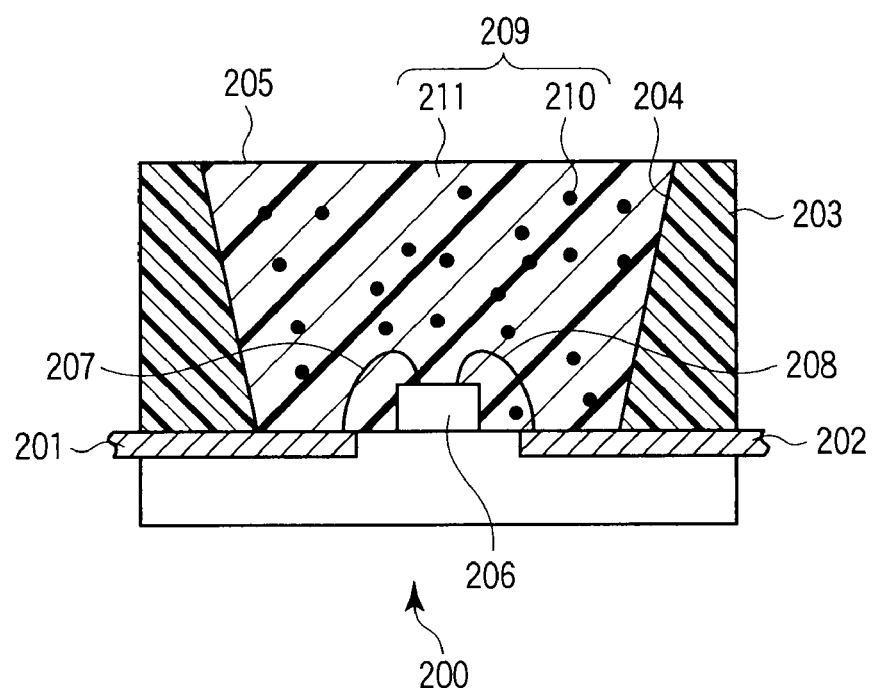
FIG. 1 is a schematic view showing the constitution of the light-emitting device according to one embodiment.

Hereinafter, embodiments will be described.

The present inventors found that a luminescent material excellent in temperature characteristics is obtained by adding a luminescent central element to a carbide oxynitride-based compound having a limited composition. The carbide oxynitride-based compound in this specification is represented by the following composition formula (A):

$$MAlSiONC \qquad (A)$$

In the composition formula (A), M is at least one metal element excluding Si and Al. Examples of the metal element M include alkaline earth metals such as Mg, Ca, Sr and Ba; rare earths such as Y, Gd, La, Lu and Sc; and alkali metals such as Li, Na and K. In addition, B, Ga, In, Ge or the like may be contained as the metal element M. The metal element M is substituted by a luminescent central element described later, and thus the ion radius of the metal element M is desirably equal to the ion radius of the luminescent central element. From this viewpoint, M is preferably an alkaline earth metal, particularly preferably Ca.

The luminescent material according to the embodiment can be obtained both by substituting a predetermined amount of the metal element M in the carbide oxynitride-based compound by the luminescent central element R and by defining the composition of its elements in a predetermined range. In the luminescent material according to the embodiment, the composition of the elements in the composition formula (1) below is defined in a predetermined range.

$$(M_{1-w}R_w)_u Al_{1-x}Si_{1+v}O_zN_tC_y \qquad (1)$$

Examples of the luminescent central element R include Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi and Fe. In consideration of variability in emission wavelength etc., at least one selected from the group consisting of Eu, Tb and Ce is preferably used.

w, u, x, v, z, t and y satisfy the following relationships: $0.001<w<0.5$; $0.66 \leq u \leq 1$; $0.07 \leq x \leq 0.73$; $0.06 \leq v \leq 0.84$; $0.04 \leq z \leq 0.44$; $2.7 \leq t \leq 3.1$; and $0.019 \leq y \leq 0.13$.

At least 0.1 mol % of the metal element M should be substituted by the luminescent central element R. When the amount of the metal element M substituted by R is less than 0.1 mol %, a sufficient luminescent effect is hardly obtained. To minimize the reduction of emission probability (concentration quenching), the amount of the luminescent central element R as a substitute for the metal element is defined to be less than 50 mol % based on the metal element M.

x is a molar ratio of Al to be reduced from 1, and v is a numerical value indicative of a molar ratio of Si to be added. When either value is too low, temperature characteristics cannot be sufficiently increased, or when the value is too high, a $CaAlSiN_3$ structure cannot be obtained. The $CaAlSiN_3$ structure refers to a crystal phase represented by the formula: $CaAlSiN_3$. Other inorganic substances having the same crystal structure as in this crystal, or solid solutions of their crystal phase, are also included in the $CaAlSiN_3$ structure.

For sufficiently increasing temperature characteristics without deterioration in emission efficiency, the carbon content y is defined in the range of 0.019 to 0.13. For sufficiently advancing the solid-phase reaction while maintaining crystallinity, the oxygen content z is defined in the range of 0.04 to 0.44. The oxygen content affects crystallinity. When the nitrogen content t is in the range of 2.7 to 3.1, crystallinity will not be deteriorated.

When the molar concentration sum u of M and R is less than 0.66, the $CaAlSiN_3$ structure cannot be obtained, and therefore, u is defined to be 0.66 or more.

Sufficient temperature characteristics can be secured when the values of x, v, z and y are in the following ranges: $0.24 \leq x \leq 0.48$; $0.25 \leq v \leq 0.52$; $0.10 \leq z \leq 0.25$; and $0.022 \leq y \leq 0.045$.

Particularly when Ca is contained as M, z is defined to be 0.11 or less and simultaneously u is defined to be 0.79 or more, thereby making the resulting luminescent material more desirable in respect of luminescence intensity and emission efficiency with a reduction in crystal defects.

The luminescent material including the specific carbide oxynitride-based compound according to the embodiment, when excited with light having a wavelength ranging from 250 nm to 500 nm, will show an emission peak in wavelengths between 580 nm and 700 nm. In other words, the luminescent material when excited with light having a wavelength ranging from 250 nm to 500 nm will show luminescence in the yellow color to red color region.

The luminescent material according to the embodiment exhibits excellent temperature characteristics by defining the composition of its elements in the predetermined range. Such composition was obtained for the first time by the present inventors.

The luminescent material according to the embodiment can be synthesized by using starting materials such as carbonates, nitrides, oxides or carbides (e.g. cyanamide) of the metal element M, nitrides, oxides or carbides of Al and Si, and oxides, nitrides or carbonates of the luminescent central element R. More specifically, when the luminescent material containing Ca as the metal element M and Eu as the luminescent central element R is contemplated, $Ca_3N_2$, AlN, $Si_3N_4$, SiC and $Eu_2O_3$ can be used as the starting materials. EuN may be used in place of $Eu_2O_3$. These materials are weighed out and mixed so as to attain the desired composition, and the resulting mixed powder can be calcined to give the objective luminescent material. The starting materials may be mixed by a mortar in a glove bag filled with an inert gas such as $N_2$ or Ar. Alternatively, the starting materials may be mixed by wet blending.

The mixed powder is charged into a crucible and calcined. The material of the crucible may be boron nitride, silicon nitride, silicon carbide, aluminum nitride, sialon, aluminum oxide, carbon, molybdenum or tungsten.

The mixed powder is calcined for a predetermined time to give the luminescent material having the objective composition. Calcination is conducted desirably at a pressure not lower than atmospheric pressure, more preferably not lower than 5 atmospheric pressure in order to prevent decomposition of silicon nitride at high temperature. The calcination temperature is preferably in the range of 1500 to 2300° C., more preferably 1900 to 2100° C. When the calcination temperature is lower than 1500° C., carbide oxynitride is hardly formed. On the other hand, when the calcination temperature is higher than 2300° C., the materials or the product may be sublimated. Because the starting material AlN is easily oxidized, calcination in an $N_2$ or Ar atmosphere is desired, or a mixed atmosphere of nitrogen and hydrogen may be used.

The powder after calcination is subjected as necessary to post-treatment such as washing to give the luminescent material according to the embodiment. Washing can be carried out for example by washing with purified water or with an acid.

In the light-emitting device shown in the cross section of FIG. 1, a resin stem 200 has a lead 201 and a lead 202 including a molded lead frame, and a resin section 203 integrally molded therein. The resin section 203 has a recess 205, an upper opening of which is wider than the base, and a reflecting surface 204 is provided on the side of this recess.

To a central part of the almost circular base of the recess 205 is mounted a light-emitting chip 206 by Ag paste, etc. As a light-emitting chip 206, a light-emitting diode or a laser diode for example may be used. Furthermore, one capable of ultraviolet emission may also be used, and shall not be limited specifically. A light-emitting chip that can emit blue light or blue-purple light, near-ultraviolet radiation, etc. may also be used, in addition to the ultraviolet light. For instance, a semiconductor light-emitting device, etc., such as a GaN series, may be used. Electrodes of the light-emitting chip 206 (not shown) are connected to the lead 201 and the lead 202, respectively, by bonding wire 207 and 208 composed of Au, etc. The arrangement of the lead 201 and 202 may be changed as appropriate.

A luminescent layer 209 is arranged in the recess 205 of the resin section 203. The luminescent layer 209 can be formed by dispersing or settling the luminescent material 210 in the embodiment at 5 weight % to 50 weight % in the resin layer 211 composed of silicone resin, for instance. The luminescent material in the embodiment makes use of a highly covalently binding nitride as the matrix, thus making it hydrophobic and extremely excellent in compatibility with resin. Accordingly, the light scattering in the resin/luminescent material interface is significantly suppressed thereby enhancing light extracting efficiency.

As a light-emitting chip 206, a flip chip type having an n-type electrode and a p-type electrode in the same plane can also be used. In this case, possible problems resulting from wire such as disconnection or detachment of wire, or light absorption by wire, etc. can be avoided, and thus a reliable semiconductor light-emitting device with high intensity can be acquired. In addition, use of an n-type substrate for the light-emitting chip 206 enables the configuration as described below. To be more specific, an n-type electrode is formed on the backside of the n-type substrate, a p-type electrode is formed on a top surface of a semiconductor layer on the substrate, and either the n-type or p-type electrode is mounted to the lead. The p-type or n-type electrode can be connected to other leads by wire. The size of the light-emitting chip 206, and dimensions and shape of the recess 205 may be changed as appropriate.

The light-emitting device in the embodiment can be suitably modified without limitation to the device of package cup type shown in FIG. 1. Specifically, the luminescent material in the embodiment can be applied to shell-type LED or surface-mounted LED to give the light-emitting device in the embodiment. The luminescent material in the embodiment has excellent temperature characteristics and can thus be used particularly in high-power input LED. The high-power input LED refers to LED into which a power of 0.5 W or more is inputted.

Hereinafter, the present invention will be described in more detail by referenced to the Examples and Comparative Example, but the present invention is not limited to the examples.

Example 1

$Ca_3N_2$, AlN, $Si_3N_4$, SiC and $Eu_2O_3$ were prepared as the starting powders. The starting powders were weighed out in amounts of 0.0323 mole, 0.09 mole, 0.033 mole, 0.01 mole and 0.0015 mole respectively in a glove box filled with a nitrogen gas, and then dry-mixed in an agate mortar to give mixed powder.

A part of this mixed powder was monoaxially molded at 50 MPa-15s to a green density of about 50%, to prepare a pellet of 15 mm in diameter. The resulting pellet was covered with mixed powder (packed powder) with the same composition to form a double crucible structure of a boron nitride crucible/carbon crucible.

This product was calcined in an $N_2$ atmosphere at 10 atmospheric pressure at 1600° C. for 2 hours, then at 1800° C. for 2 hours, and at 2000° C. for 2 hours, to synthesize the luminescent material in this example.

The luminescent material after calcination was a mixture of a sintered body and sintered powder each having a red body color, and as a result of excitation thereof with a black light and with an LED having a peak wavelength of 457 nm, red luminescence was observed.

Example 2

A sintered body was prepared from the mixed powder obtained in Example 1. Specifically, mixed powder prepared in the same manner as in Example 1 was put between carbon sheets and calcined at a pressure of 30 MPa by SPS (spark plasma calcination) in an $N_2$ atmosphere at 0.1 MPa at 1800° C. for 10 minutes.

The luminescent material after calcination was a sintered body having a red body color. The carbon sheets were removed by polishing, and as a result of excitation thereof with a black light and with an LED having a peak wavelength of 457 nm, red luminescence was observed.

The powder and sintered body in Example 1 were collected from the crucible and pulverized in a mortar. The product was excited with a light-emitting diode having a peak wavelength of 457 nm, and its emission spectrum was observed. The red powder in Example 2 was also pulverized in the same manner and excited with light at 457 nm, and its emission spectrum was observed.

Figure 2:
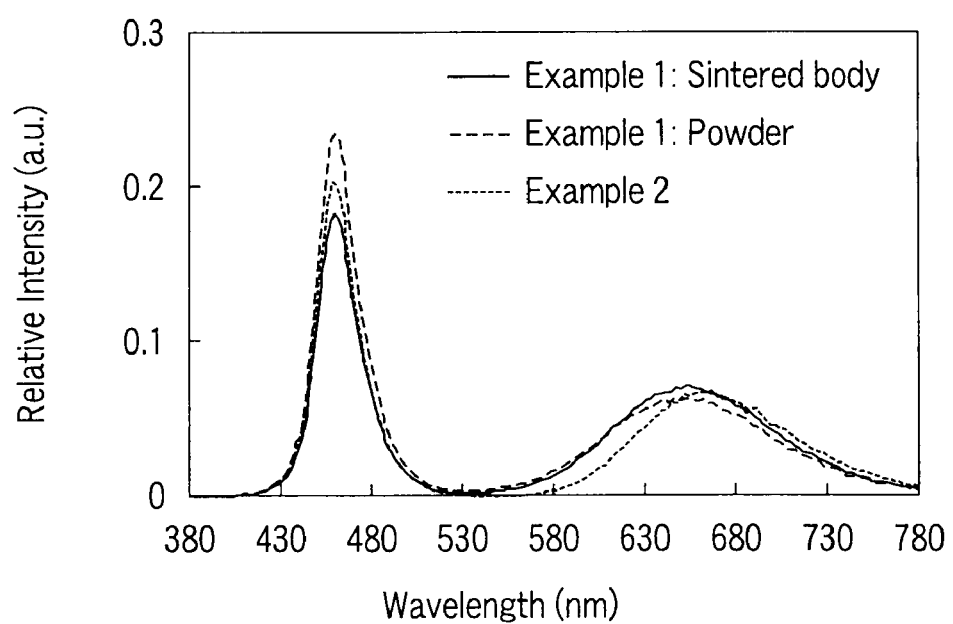
FIG. 2 is an emission spectrum of luminescent materials in Examples 1 to 2 photoexcited at 457 nm.

The obtained results are shown in FIG. 2. In FIG. 2, bands showing their peak at 457 nm are attributable to reflection of excitation light. From any of the red powders, luminescence with a single band having a peak wavelength at 620 to 640 nm was obtained. The single band refers to luminescence having only one peak wavelength with the maximum luminescence intensity.

Figure 3:
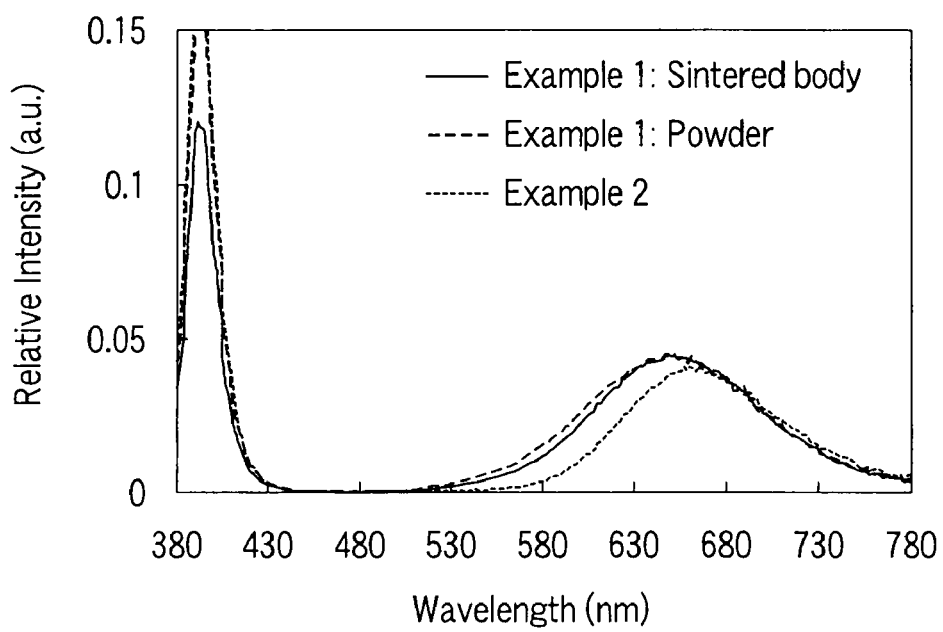
FIG. 3 is an emission spectrum of luminescent materials in Examples 1 to 2 photoexcited at 395 nm.

The powder and sintered body in Example 1 and the red powder in Example 2 were similarly excited with a light-emitting diode having a peak wavelength of 395 nm, and their emission spectra were observed. The results are shown in FIG. 3. In FIG. 3, bands showing their peak at 395 nm are attributable to reflection of excitation light. From any of the red powders, luminescence with a single band having a peak wavelength at 620 to 640 nm was obtained.

Example 3

A luminescent material in this example was synthesized in the same manner as in Example 1 except that the amount of $Ca_3N_2$ compounded was changed to 0.0328 mole, the amount of $Eu_2O_3$ compounded was changed to 0.0008 mole, the amount of AlN compounded was changed to 0.075 mole, and the amount of SiC compounded was changed to 0.025 mole.

The luminescent material after calcination was a mixture of a sintered body and sintered powder each having a red body color, and as a result of excitation thereof with a black light and with an LED having a peak wavelength of 457 nm, red luminescence was observed.

Example 4

A luminescent material in this example was synthesized in the same manner as in Example 3 except that the amount of AlN compounded was changed to 0.05 mole, and the amount of SiC compounded was changed to 0.05 mole.

The luminescent material after calcination was a mixture of a sintered body and sintered powder each having a red body color, and as a result of excitation thereof with a black light and with an LED having a peak wavelength of 457 nm, red luminescence was observed.

Example 5

A luminescent material in this example was synthesized in the same manner as in Example 3 except that the amount of AlN compounded was changed to 0.025 mole, and the amount of SiC compounded was changed to 0.075 mole.

The luminescent material after calcination was a mixture of a sintered body and sintered powder each having a red body color, and as a result of excitation thereof with a black light and with an LED having a peak wavelength of 457 nm, red luminescence was observed.

The powder and sintered body in Example 3 were collected from the crucible and pulverized in a mortar. The product was excited with a light-emitting diode having peak wavelengths of 457 nm and 395 nm, and its emission spectrum was observed. The sintered bodies in Examples 4 and 5 were also pulverized in the same manner and excited with light at 457 nm, and their emission spectra were observed.

Figure 4:
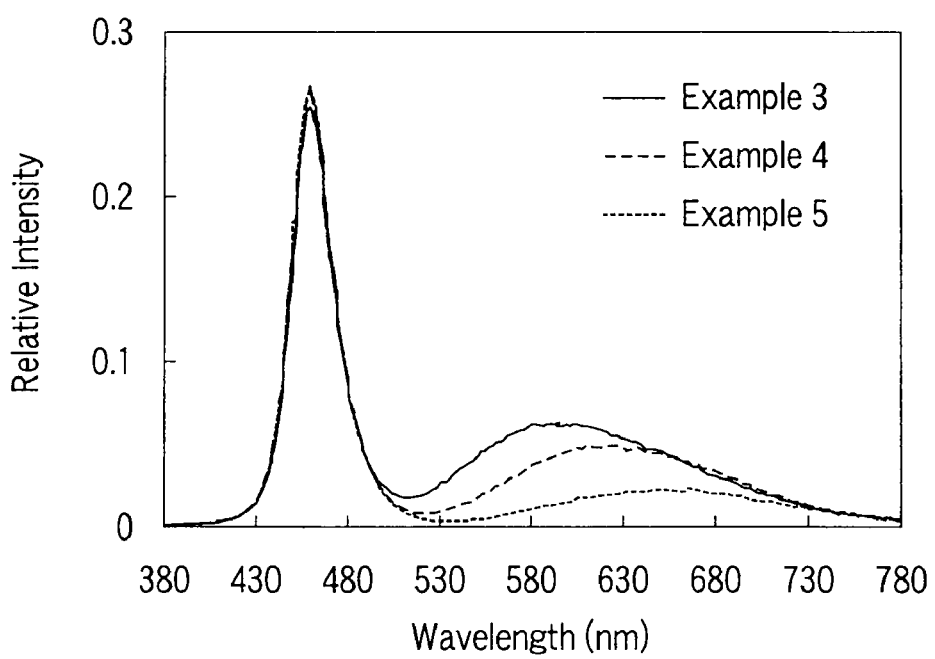
FIG. 4 is an emission spectrum of luminescent materials in Examples 3 to 5 photoexcited at 457 nm.
Figure 5:
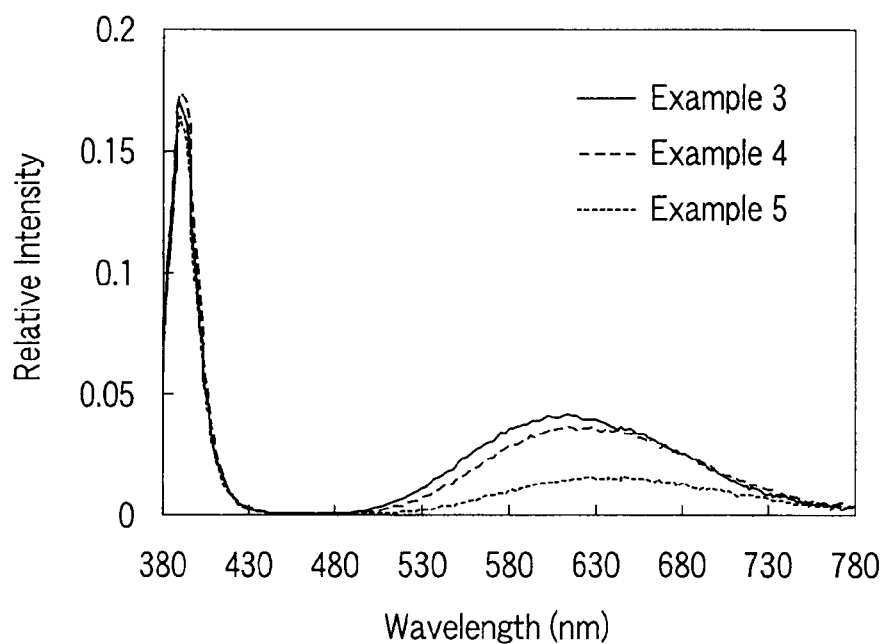
FIG. 5 is an emission spectrum of luminescent materials in Examples 3 to 5 photoexcited at 395 nm.

The obtained results are shown in FIGS. 4 and 5. In FIGS. 4 and 5, bands showing peaks at 457 nm and 395 nm are attributable to reflection of excitation light. From any of the red powders, luminescence with a single band having a peak wavelength at 620 to 660 nm was obtained.

Example 6

$Ca_3N_2$, AlN, $Si_3N_4$, SiC and EuN were prepared as the starting powders. The starting powders were weighed out in amounts of 0.0328 mole, 0.075 mole, 0.033 mole, 0.025 mole and 0.0016 mole respectively in a glove box filled with a nitrogen gas with humidity regulated at 3% or less, and then dry-mixed by an agate mortar to give mixed powder.

This mixed powder was charged into a boron nitride crucible, and this boron nitride crucible was placed in a carbon crucible to form a double crucible structure.

The product was calcined in an $N_2$ atmosphere at 10 atmospheric pressure at 1600° C. for 2 hours, then at 1800° C. for 2 hours, and at 2050° C. for 2 hours, to synthesize the luminescent material in this example.

The luminescent material after calcination was sintered powder having a red body color, and as a result of excitation thereof with a black light and with an LED having a peak wavelength of 457 nm, red luminescence was observed.

Example 7

A luminescent material in this example was synthesized in the same manner as in Example 6 except that the amount of $Ca_3N_2$ compounded was changed to 0.033 mole, and the amount of EuN compounded was changed to 0.001 mole.

The luminescent material after calcination was a sintered body having a red body color, and as a result of excitation thereof with a black light and with an LED having a peak wavelength of 457 nm, red luminescence was observed.

Example 8

A luminescent material in this example was synthesized in the same manner as in Example 6 except that the amount of $Ca_3N_2$ compounded was changed to 0.03266 mole, and the amount of EuN compounded was changed to 0.002 mole.

The luminescent material after calcination was sintered powder having a red body color, and as a result of excitation thereof with a black light and with an LED having a peak wavelength of 457 nm, red luminescence was observed.

Example 9

A luminescent material in this example was synthesized in the same manner as in Example 6 except that the amount of $Ca_3N_2$ compounded was changed to 0.03253 mole, and the amount of EuN compounded was changed to 0.0024 mole.

The luminescent material after calcination was sintered powder having a red body color, and as a result of excitation thereof with a black light and with an LED having a peak wavelength of 457 nm, red luminescence was observed.

Example 10

A luminescent material in this example was synthesized in the same manner as in Example 6 except that the amount of AlN compounded was changed to 0.05 mole, and the amount of SiC compounded was changed to 0.05 mole.

The luminescent material after calcination was sintered powder having a red body color, and as a result of excitation thereof with a black light and with an LED having a peak wavelength of 457 nm, red luminescence was observed.

Figure 6:
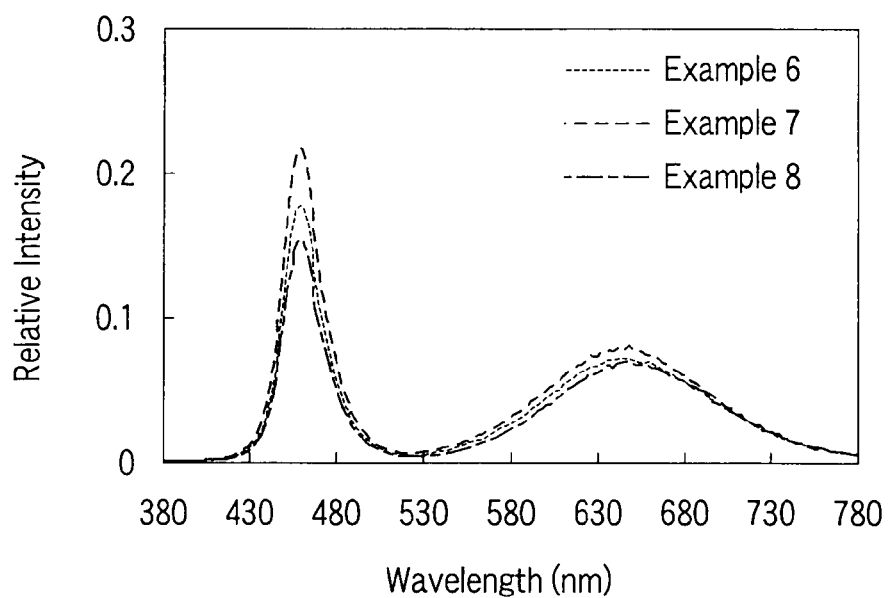
FIG. 6 is an emission spectrum of luminescent materials in Examples 6 to 8 photoexcited at 457 nm.

The sintered bodies in Examples 6 to 10 were collected from the crucible and pulverized in a mortar. Each of the products was excited with a light-emitting diode having a peak wavelength of 457 nm, and its emission spectrum was observed. The obtained results are shown in FIGS. 6 and 7.

In addition, the sintered bodies in Examples 6 to 10 were collected from the crucible and pulverized in a mortar. Each of the products was excited with a light-emitting diode having a peak wavelength of 395 nm, and its emission spectrum was observed. The obtained results are shown in FIGS. 8 and 9.

In FIGS. 6 to 9, bands showing their peak at 457 nm are attributable to reflection of excitation light. From any of the red powders, luminescence with a single band having a peak wavelength at 645 to 665 nm was obtained.

Example 11

A luminescent material in this example was synthesized by the same manner as in Example 7 except that the weighing and mixing of the starting materials were conducted in a vacuum glove box.

The luminescent material after calcination was sintered powder having a red body color, and as a result of excitation thereof with a black light and with an LED having a peak wavelength of 457 nm, red luminescence was observed.

Example 12

A luminescent material in this example was synthesized by the same manner as in Example 6 except that the weighing and mixing of the starting materials were conducted in a vacuum glove box.

The luminescent material after calcination was sintered powder having a red body color, and as a result of excitation thereof with a black light and with an LED having a peak wavelength of 457 nm, red luminescence was observed.

Example 13

A luminescent material in this example was synthesized by the same manner as in Example 8 except that the weighing and mixing of the starting materials were conducted in a vacuum glove box.

The luminescent material after calcination was sintered powder having a red body color, and as a result of excitation thereof with a black light and with an LED having a peak wavelength of 457 nm, red luminescence was observed.

Example 14

A luminescent material in this example was synthesized by the same manner as in Example 9 except that the weighing and mixing of the starting materials were conducted in a vacuum glove box.

The luminescent material after calcination was sintered powder having a red body color, and as a result of excitation thereof with a black light and with an LED having a peak wavelength of 457 nm, red luminescence was observed.

The sintered powders in Examples 11 to 14 were collected from the crucible and pulverized in a mortar. Each of the products was excited with a light-emitting diode having a peak wavelength of 457 nm, and its emission spectrum was observed. The obtained results are shown in FIGS. 10 and 11.

In addition, the sintered powders in Examples 11 to 14 were collected from the crucible and pulverized in a mortar. Each of the products was excited with a light-emitting diode having a peak wavelength of 395 nm, and its emission spectrum was observed. The obtained results are shown in FIGS. 12 and 13.

In FIGS. 10 to 13, bands showing their peaks at 457 nm and 395 nm are attributable to reflection of excitation light. From any of the red powders, luminescence with a single band having a peak wavelength at 645 to 665 nm was obtained.

Comparative Example 1

A luminescent material in this comparative example was synthesized in the same manner as in Example 1 except that the amount of AlN compounded was changed to 0.1 mole, and the amount of SiC compounded was changed to 0 mole. The luminescent material after calcination was a mixture of a sintered body and sintered powder each having a red body color, and as a result of excitation thereof with a black light and with an LED having a peak wavelength of 457 nm, red luminescence was observed.

Chemical analysis of the red powders in Examples 1 to 6, 8, 11 to 14 and Comparative Example 1 was conducted. The results are collectively shown in Table 1 below. A value in Table 1 indicates a molar ratio standardized assuming that the total number of moles is 6.

TABLE 1

|  | Ca | Eu | Ca + Eu | Al | Si | O | N | C |
|---|---|---|---|---|---|---|---|---|
| Example 1 sintered body | 0.81 | 0.022 | 0.83 | 0.88 | 1.08 | 0.41 | 2.8 | 0.019 |
| Example 1 powder | 0.73 | 0.016 | 0.74 | 0.93 | 1.11 | 0.26 | 2.9 | 0.024 |
| Example 2 | 0.85 | 0.022 | 0.88 | 0.86 | 1.06 | 0.44 | 2.7 | 0.077 |
| Example 3 | 0.78 | 0.009 | 0.79 | 0.76 | 1.25 | 0.25 | 2.9 | 0.022 |
| Example 4 | 0.74 | 0.005 | 0.74 | 0.52 | 1.52 | 0.10 | 3.1 | 0.045 |

TABLE 1-continued

|  | Ca | Eu | Ca + Eu | Al | Si | O | N | C |
|---|---|---|---|---|---|---|---|---|
| Example 5 | 0.65 | 0.005 | 0.66 | 0.27 | 1.84 | 0.06 | 3.0 | 0.13 |
| Example 6 | 0.80 | 0.010 | 0.81 | 0.75 | 1.29 | 0.11 | 3.0 | 0.02 |
| Example 8 | 0.79 | 0.011 | 0.80 | 0.76 | 1.30 | 0.09 | 3.0 | 0.03 |
| Example 11 | 0.82 | 0.003 | 0.80 | 0.76 | 1.28 | 0.04 | 3.1 | 0.023 |
| Example 12 | 0.81 | 0.006 | 0.79 | 0.76 | 1.28 | 0.05 | 3.1 | 0.026 |
| Example 13 | 0.83 | 0.007 | 0.81 | 0.75 | 1.26 | 0.05 | 3.1 | 0.023 |
| Example 14 | 0.78 | 0.010 | 0.76 | 0.78 | 1.30 | 0.04 | 3.1 | 0.028 |
| Comparative Example 1 | 0.887 | 0.014 | 0.90 | 0.97 | 0.96 | 0.24 | 3.0 | 0.006 |

Compositions of the luminescent materials in the Examples and Comparative Example, when expressed by w, u, x, v, z, t, and y in the formula 1, are as follows:

TABLE 2

|  | w | u | x | v | z | t | y |
|---|---|---|---|---|---|---|---|
| Example 1 sintered body | 0.026 | 0.83 | 0.12 | 0.08 | 0.41 | 2.8 | 0.019 |
| Example 1 powder | 0.022 | 0.74 | 0.07 | 0.11 | 0.26 | 2.9 | 0.024 |
| Example 2 | 0.025 | 0.88 | 0.14 | 0.06 | 0.44 | 2.7 | 0.077 |
| Example 3 | 0.012 | 0.79 | 0.24 | 0.25 | 0.25 | 2.9 | 0.022 |
| Example 4 | 0.007 | 0.74 | 0.48 | 0.52 | 0.10 | 3.1 | 0.045 |
| Example 5 | 0.008 | 0.66 | 0.73 | 0.84 | 0.06 | 3.0 | 0.13 |
| Example 6 | 0.012 | 0.81 | 0.25 | 0.29 | 0.11 | 3.0 | 0.02 |
| Example 8 | 0.014 | 0.80 | 0.24 | 0.30 | 0.09 | 3.0 | 0.03 |
| Example 11 | 0.004 | 0.80 | 0.24 | 0.28 | 0.04 | 3.1 | 0.023 |
| Example 12 | 0.007 | 0.79 | 0.24 | 0.28 | 0.05 | 3.1 | 0.026 |
| Example 13 | 0.008 | 0.81 | 0.25 | 0.26 | 0.05 | 3.1 | 0.023 |
| Example 14 | 0.012 | 0.76 | 0.22 | 0.30 | 0.04 | 3.1 | 0.028 |
| Comparative Example 1 | 0.019 | 0.90 | 0.03 | −0.04 | 0.24 | 3.0 | 0.006 |

As shown in Table 2 above, w, u, x, v, z, t and y in any luminescent materials in the Examples are in the predetermined range in the formula 1 above.

The peak wavelength, absorption efficiency, internal quantum efficiency and external quantum efficiency of the luminescent materials in Examples 1 to 14 upon excitation at 457 nm are collectively shown in Table 3 below. For calculation of absorption efficiency, internal quantum efficiency and external quantum efficiency, the number of incident photons in excitation light applied to the sample and the number of reflected photons in excitation light reflected by the surface of the sample were measured by a spectrum measuring instrument. Using a total reflection spectrum $E(\lambda)$ of the excitation light, a reflection spectrum $R(\lambda)$ of the excitation light for the sample, and an emission spectrum $P(\lambda)$ of the sample, absorption efficiency, internal quantum efficiency and external quantum efficiency were determined according to the following formulas respectively.

$$\text{Absorption efficiency} = \frac{\int \lambda \cdot [E(\lambda) - R(\lambda)] d\lambda}{\int \lambda \cdot [E(\lambda)] d\lambda}$$

$$\text{Internal quantum efficiency} = \frac{\int \lambda \cdot [P(\lambda)] d\lambda}{\int \lambda \cdot [E(\lambda) - R(\lambda)] d\lambda}$$

$$\text{External quantum efficiency} = \frac{\int \lambda \cdot [P(\lambda)] d\lambda}{\int \lambda \cdot [E(\lambda)] d\lambda}$$

E(λ): total reflection spectrum of excitation light
R(λ): reflection spectrum of excitation light for sample
P(λ): emission spectrum of sample

TABLE 3

|  | Peak wavelength (nm) | Absorption efficiency | Internal quantum efficiency | External quantum efficiency |
|---|---|---|---|---|
| Example 1 sintered body | 655 | 0.81 | 0.46 | 0.37 |
| Example 1 powder | 646 | 0.76 | 0.46 | 0.35 |
| Example 2 | 661 | 0.79 | 0.42 | 0.33 |
| Example 3 | 636 | 0.75 | 0.49 | 0.37 |
| Example 4 | 646 | 0.71 | 0.45 | 0.32 |
| Example 5 | 666 | 0.73 | 0.20 | 0.15 |
| Example 6 | 645 | 0.81 | 0.51 | 0.41 |
| Example 7 | 648 | 0.77 | 0.58 | 0.45 |
| Example 8 | 645 | 0.81 | 0.51 | 0.41 |
| Example 9 | 646 | 0.84 | 0.47 | 0.39 |
| Example 10 | 656 | 0.86 | 0.49 | 0.42 |
| Example 11 | 624 | 0.72 | 0.57 | 0.41 |
| Example 12 | 638 | 0.80 | 0.53 | 0.43 |
| Example 13 | 647 | 0.81 | 0.53 | 0.43 |
| Example 14 | 648 | 0.85 | 0.45 | 0.38 |

As shown in Table 3 above, a high external quantum efficiency of 0.4 or more is obtained in any of Examples 6, 7, 8, 10, and 11 to 13. In the luminescent materials in these examples, z and u in the formula 1 are 0.11 or less and 0.79 or more, respectively.

Example 15

A luminescent material in this example was synthesized in the same manner as in Example 1 except that 0.0008 mole of $Eu_2O_3$ was changed to 0.0004 mole of $Tb_4O_7$. The luminescent material after calcination was a mixture of a sintered body and sintered powder each having a pale yellow body color, and green luminescence was observed upon excitation with a black light, and yellow luminescence was observed upon excitation at 395 nm and excitation at 457 nm.

The sintered body in Example 15 was collected from the crucible and pulverized in a mortar. The product was excited with a light-emitting diode having a peak wavelength of 457 nm and with a UV lamp having a peak wavelength of 365 nm, and its emission spectrum was observed.

The obtained results are shown in FIGS. 14 and 15. In FIGS. 14 and 15, bands showing their peaks at 457 nm and 365 nm are attributable to reflection of excitation light. Luminescence with a single band having a peak wavelength at 610 nm was obtained upon excitation at 457 nm, and luminescence having peaks at 491 nm, 547 nm, 586 nm and 622 nm was obtained upon excitation at 365 nm.

Example 16

A luminescent material in this example was synthesized in the same manner as in Example 1 except that 0.0008 mole of $Eu_2O_3$ was changed to 0.0016 mole of $CeO_2$. The luminescent material after calcination was a mixture of a sintered body and sintered powder each having a pale yellow body color, and orange-colored luminescence was observed upon excitation at 395 nm and excitation at 457 nm.

The sintered body in Example 16 was collected from the crucible and pulverized in a mortar. The product was excited with a light-emitting diode having a peak wavelength of 457 nm, and its emission spectrum was observed.

The obtained results are shown in FIG. 16. In FIG. 16, bands showing their peak at 457 nm are attributable to reflection of excitation light. Luminescence with a single band having a peak wavelength at 600 nm was obtained upon excitation at 457 nm.

The red powders in Examples 1 to 6 and Comparative Example 1 were measured for their X-ray diffraction by CuKα characteristic X-ray (wavelength 1.54056 Å). The resulting profiles are shown in FIGS. 17 to 24. When these profiles are checked against JPCDS cards, their main phase agreed with 39-0747 $CaAlSiN_3$. The JPCDS cards are a collection of data in which peak profiles of various substances by X-ray diffractometry are collected.

On the basis of XRD profiles in FIGS. 17 to 24, the length of axis a of the $CaAlSiN_3$ structure of the main phase was calculated. The obtained length of axis a, which is plotted against the charged $3SiC/Si_3N_4$ ratio, is shown in FIG. 25. FIG. 25 shows that the length of axis a is reduced flatly as the amount of SiC charged is increased. This agrees with the fact that the bond length of Si—C is shorter than the bond length of Al—N.

When the excitation wavelength was changed to 254 nm, 365 nm, 390 nm and 460 nm, luminescence having peaks in the same wavelength range was confirmed. When the excitation wavelength is too short, loss by stokes shift is increased, while when the excitation wavelength is too long, excitation efficiency may be decreased.

Each of the red powders in Examples 1, 3 to 5, 8 to 11 and Comparative Example 1 was excited at an increasing temperature of the sample from room temperature to 200° C. by a heater to measure a change in emission spectrum. In excitation, a light-emitting diode having a peak wavelength of 458 nm was used. The temperature dependence of peak intensity in emission spectrum at each temperature is shown in graphs in FIGS. 26 to 28. The y-axis in each graph indicates values standardized assuming that the emission intensity of each luminescent material at room temperature is 1. FIG. 26 shows the results of the luminescent materials in Examples 1, 3 and 4, and FIG. 27 shows the results of the luminescent materials in Examples 5 and 8. FIG. 28 shows the results in Examples 9 and 10. The result in Comparative Example 1 is also shown in each graph.

The graphs in FIGS. 26 to 28 show that the luminescent materials in Examples 1, 3 to 5, and 8 to 11 undergo less reduction in emission intensity even under the high-temperature condition of 200° C. and are made more excellent in temperature characteristics with an increasing amount of SiC charged. From this result, it can be seen that the luminescent materials in the embodiment are superior in temperature characteristics to SiC-free $CaAlSiN_3$:Eu. In values derived from the analyzed compositions in Examples 3 and 4, x, v, z and y as shown in Table 2 are in the following ranges: $0.24 \leq x \leq 0.48$; $0.25 \leq v \leq 0.52$; $0.10 \leq z \leq 0.25$; and $0.022 \leq y \leq 0.045$.

The graphs in FIGS. 26 to 28 show the results of the luminescent materials in Examples 1, 3 to 5, and 8 to 11, but the luminescent materials in other examples also have temperature characteristics superior to those in the Comparative Example.

The luminescent material in Example 3 was used to produce the light-emitting device shown in FIG. 1. When the resulting light-emitting device was operated in the temperature range of from room temperature to 150° C. to measure a change in efficiency by temperature, the efficiency was hardly decreased in this temperature range. From this result, it was confirmed that the light-emitting device according to the embodiment has excellent temperature characteristics.

When the same light-emitting device as above was produced using the luminescent material in Comparative Example 1 and examined in the same manner, a significant reduction in efficiency was observed in this temperature range. It was thus confirmed that even a carbide oxynitride-based compound containing a luminescent central element cannot attain excellent temperature characteristics unless its composition is in the predetermined composition range.

According to the embodiment of the present invention, there are provided a luminescent material excellent in temperature characteristics and a light-emitting element using the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A luminescent material comprising:
a carbide oxynitride-based compound having a composition represented by formula 1:

  formula 1 wherein M is at least one metal element excluding Si and Al, R is a luminescent central element, w, u, x, v, z, t and y satisfy following relationships:
$0.001 < w < 0.5$; $0.66 \leq u \leq 1$; $0.07 \times 0.73$;
$0.06 \leq v \leq 0.84$; $0.04 \leq z \leq 0.44$; $2.7 \leq t \leq 3.1$; and
$0.019 \leq y \leq 0.13$.

2. The luminescent material according to claim 1, wherein M is selected from the group consisting of Mg, Ca, Sr, Ba, Y, Gd, La, Lu, Sc, Li, Na, K, B, Ga, In and Ge and wherein the luminescent material upon excitation with light having a wavelength ranging from 250 to 500 nm shows an emission peak at a wavelength between 580 nm and 700 nm.

3. The luminescent material according to claim 2, wherein M is selected from the group consisting of Y, Gd, La, Lu, Sc, Li, Na, K, B, Ga, In and Ge.

4. The luminescent material according to claim 2, wherein R is selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi and Fe.

5. The luminescent material according to claim 1, wherein M in the formula 1 is an alkaline earth metal element.

6. The luminescent material according to claim 5, wherein x, v, z and y in the formula 1 are in following ranges:
$0.24 \times 0.48$; $0.25 \leq v \leq 0.52$; $0.10 \leq z \leq 0.25$; and $0.022 \leq y \leq 0.045$.

7. The luminescent material according to claim 1, wherein M in the formula 1 is Ca.

8. The luminescent material according to claim 7, wherein in the formula 1, z is 0.11 or less and u is 0.79 or more.

9. The luminescent material according to claim 8, wherein R is selected from the group consisting of Eu, Tb and Ce.

10. A light-emitting device comprising:
a light-emitting element capable of emitting light having a wavelength ranging from 250 to 500 nm; and
a luminescent layer comprising a luminescent material configured to be irradiated with the light, at least part of the luminescent material being the luminescent material of claim 1.

11. The luminescent material according to claim 5, wherein the luminescent material upon excitation with light having a wavelength ranging from 250 nm to 500 nm shows an emission peak at a wavelength between 580 nm and 700 nm.

12. The luminescent material according to claim 6, wherein the luminescent material upon excitation with light having a wavelength ranging from 250 nm to 500 nm shows an emission peak at a wavelength between 580 nm and 700 nm.

13. The luminescent material according to claim 7, wherein the luminescent material upon excitation with light having a wavelength ranging from 250 nm to 500 nm shows an emission peak at a wavelength between 580 nm and 700 nm.

14. The luminescent material according to claim 8, wherein the luminescent material upon excitation with light having a wavelength ranging from 250 nm to 500 nm shows an emission peak at a wavelength between 580 nm and 700 nm.

15. The luminescent material according to claim 9, wherein the luminescent material upon excitation with light having a wavelength ranging from 250 nm to 500 nm shows an emission peak at a wavelength between 580 nm and 700 nm.

* * * * *